(12) United States Patent
Schrödinger et al.

(10) Patent No.: US 6,781,449 B2
(45) Date of Patent: Aug. 24, 2004

(54) ELECTRONIC OUTPUT STAGE

(75) Inventors: Karl Schrödinger, Berlin (DE); Jaro Robert Stimma, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/261,193

(22) Filed: Sep. 30, 2002

(65) Prior Publication Data

US 2003/0085763 A1 May 8, 2003

Related U.S. Application Data

(63) Continuation of application No. PCT/DE01/01234, filed on Mar. 28, 2001.

(30) Foreign Application Priority Data

Mar. 29, 2000 (DE) .......................... 100 16 445

(51) Int. Cl.$^7$ ................................ H03F 1/02
(52) U.S. Cl. ........................ 330/9; 330/252; 330/253
(58) Field of Search ............................ 330/9, 252, 253

(56) References Cited

U.S. PATENT DOCUMENTS

| | | |
|---|---|---|
| 4,833,423 A | 5/1989 | Molloy |
| 4,859,961 A | 8/1989 | Davenport |
| 5,373,249 A | 12/1994 | Barrett, Jr. et al. |
| 5,451,902 A | 9/1995 | Huang et al. |
| 5,493,253 A | 2/1996 | Ogou |

FOREIGN PATENT DOCUMENTS

| | | |
|---|---|---|
| EP | 0 525 656 A1 | 2/1993 |
| JP | 6303051 | 10/1994 |

OTHER PUBLICATIONS

Laug "A high–current very wide–band tranconductance amplifier" IEEE Tranactions on Instrumentation and Measurement vol. 39, Issue 1, Feb. 1990 pp. 42–47.
Preisach H.: "Makrozellen für serielle Gbit/s Schnittstellen in 0.35 μm CMOS" [Makrocells For Serial Gbit/s Interfaces in 0,35 μm CMOS], Tagungsband 8, ITG Fachbericht 147, Hannover, pp. 107–112.

*Primary Examiner*—Michael B. Shingleton
(74) *Attorney, Agent, or Firm*—Laurence A. Greenberg; Werner H. Stemer; Gregory L. Mayback

(57) ABSTRACT

An electronic output module, especially an electronic output module for CMOS-LVDS levels (LVDS-low voltage differential signalling), is suitable for analogue and digital high-frequency circuits. The output module has a first and a second transistor which are connected to a current source at a first connection and to input terminals by a control connection. A third and a fourth transistor are connected to a supply voltage potential by a first connection, to a second connection of the first and second transistors, and to an output terminal by a second connection and to converted input signals by a control connection.

14 Claims, 2 Drawing Sheets

ELECTRONIC OUTPUT STAGE

CROSS-REFERENCE TO RELATED APPLICATION

This application is a continuation of copending International Application No. PCT/DE01/01234, filed Mar. 28, 2001, which designated the United States and which was not published in English.

BACKGROUND OF THE INVENTION

Field of the Invention

The invention lies in the fields of electronics and electronic circuits. More specifically, the invention relates to an electronic output stage, particularly to an output stage for CMOS LVDS (Low Voltage Differential Signaling) levels for use in analog and digital high-frequency circuits.

The publication "Makrozellen für serielle Gbit/s Schnittstellen in 0.35 µm CMOS" (Tagungsband 8, ITG Fachtagung 3.-4.3.98 Hannover, pp.107–112, ITG Fachbericht 147) describes a circuit for an electronic output stage for digital signals with a large-signal control. The output stage comprises a controlled push-pull stage whereby a high-level signal and a low-level signal can be independently controlled. The control is carried out i) individually for the high and low levels by means of analog control voltages from a reference block and a digital scaling, or ii) only by means of digital scaling. The digital scaling can be set by way of a computer interface. The prior art circuit has the disadvantage that a full CMOS swing (e.g., 3.3. or 5 Volts) and an expensive control for the bias currents of the provided differential amplifier stages are needed for drive purposes. In the prior art circuit, the transistors of the electronic output stages are used as switches, and therefore they can be operated in an unsaturated state.

SUMMARY OF THE INVENTION

It is accordingly an object of the invention to provide an electronic output stage for CMOS LVDS levels which overcomes the above-mentioned disadvantages of the heretofore-known devices and methods of this general type and wherein the electronic output stage can be driven with small signals, preferably with high-frequency small signals.

With the foregoing and other objects in view there is provided, in accordance with the invention, an electronic output stage for amplifying differential input signals with a small voltage swing, in particular high-frequency input signals. The novel output stage comprises:

a first input terminal, a second input terminal, a first output terminal, and a second output terminal;

a controlled current source;

a first transistor having a first terminal connected to the controlled current source, a second terminal, and a control terminal connected to the first input terminal;

a second transistors having a first terminal connected to the controlled current source, a second terminal, and a control terminal connected to the second input terminal;

a third transistor having a first terminal connected to a first supply voltage potential, a second terminal connected to the second terminal of the first transistor and to the first output terminal;

a fourth transistor having a first terminal connected to the first supply voltage potential, a second terminal connected to the second terminal of the second transistor and to the second output terminal;

the control terminals of the third and fourth transistors receiving respective drive signals formed from the input signals by amplifying and providing the input signals with an adjustable offset voltage; and wherein a voltage change of the input signals and drive signals at the first and third transistors and at the second and fourth transistors, respectively, behave in opposite ways.

In accordance with an added feature of the invention, at least one of the output voltages of the output terminal is adjustable with the offset voltage, and a current flowing through the first and second output terminals and an output resistance is adjustable with the current source and a dimensioning of the third and fourth transistors.

In accordance with an additional feature of the invention, the first and second transistors have equal dimensions, and the third and fourth transistors have equal dimensions. Preferably, also, the first, second, third, and fourth transistors are all MOS transistors.

In accordance with another feature of the invention, there is provided a differential amplifier circuit for setting the offset voltage such that the third and fourth transistors are at least partly conductive.

In accordance with a further feature of the invention, the current source is set such that an output current equals approximately 3.5 mA. The third and fourth transistors are preferably dimensioned such that an output resistance between the first and second output terminals equals approximately 50 ohms. That is, with suitable dimensioning of the electronic elements of the output stage, it is possible to realize an output resistance of approx. 50 ohms, which is required by the LVDS standard and strongly recommended for high-frequency drivers.

In accordance with again an added feature of the invention, the offset voltage is set to result in a voltage offset value between the first and second output terminals of approximately 1.2 V.

In accordance with again an additional feature of the invention, there is provided a voltage control circuit for regulating the offset voltage. Also, there may be provided a differential amplifier circuit having a voltage supply. In that case, the offset voltage is regulated by controlling the voltage supply to the differential amplifier.

In accordance with yet an added feature of the invention, there is provided a mirror circuit for setting a current through the first and second output terminals and a voltage between the first and second output terminals, the mirror circuit comprising two input terminals carrying respective reference voltages and the mirror circuit controlling the current source and the offset voltage such that a low level at one of the output terminals and a high level at another of the output terminals correspond to each of the reference voltages, respectively.

In accordance with yet a further feature of the invention, a high level of the output voltage is set with the regulated offset voltage. A low level of the output voltage is set with the current impressed by the current source.

The primary advantage achieved by the invention compared to the prior art is that the proposed electronic output stage can be driven with high-frequency small signals (<1V). This is advantageous particularly when amplifier circuits are integrated wherein small swings predominate.

Further advantages over the prior art are a reduced power loss and an ability to forgo the controlling of the current sources.

Another advantage of the electronic output stage compared to pure digital CMOS circuits is that there are no high-frequency voltage and current peaks which could interfere with the sensitive analog circuits. In the proposed circuit, a substantially constant current is generated in output drivers by the current sources. The transistors are driven in the saturated state.

Furthermore, interference is prevented by the reduced input swing.

Other features which are considered as characteristic for the invention are set forth in the appended claims.

Although the invention is illustrated and described herein as embodied in an electronic output stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
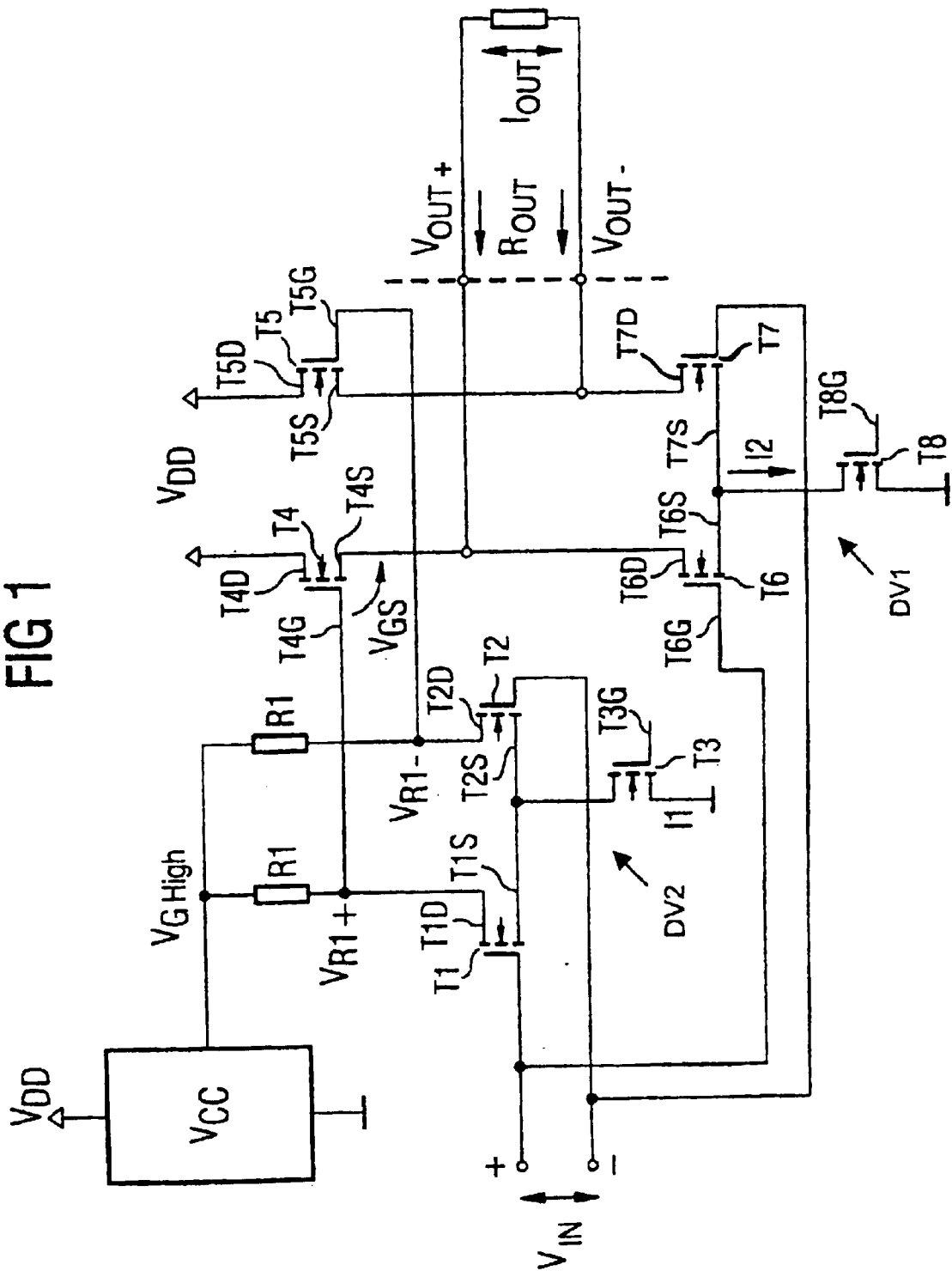
FIG. 1 is a schematic diagram of an LVDS output stage according to the invention.

Referring now to the figures of the drawing in detail and first, particularly, to FIG. 1 thereof, there is shown an LVDS output stage. A differential input voltage $V_{IN}$ drives an output stage comprising n-channel MOS transistors T6, T7 and T8. The transistors T6 and T7 are identically constructed and connected as a differential amplifier DV1; that is, their source terminals T6S, T7S are connected to each other and to the transistor T8, which is a controlled current source T8 that impresses a current I2. The current I2 is set with a suitable voltage at the control terminal T8G of the transistor T8, so that the current I2 equals somewhat more than 3.5 mA. The non-inverting input $V_{IN+}$ is connected to the control terminal T6G of the transistor T6. The inverting input $V_{IN-}$ is connected to the control terminal T7G of the transistor T7. An output signal $V_{OUT}$ is tapped off at the drain terminals T6D, T7D of the transistors T6 and T7. The inverted output signal $V_{OUT+}$ is thereby tapped at the drain terminal T6D of the transistor T6, and the non-inverted output signal $V_{OUT-}$ is tapped off at the drain terminal T7D of the transistor T7.

A source terminal T4S of an n-channel MOS transistor T4 is connected to the drain terminal T6D of the transistor T6. A source terminal T5S of an n-channel MOS transistor T5 is connected to the drain terminal T7D of the transistor T7. The drain terminals T4D, T5D of the likewise identically constructed transistors T4 and T5 are connected to a supply voltage potential $V_{DD}$. A differential signal from a differential amplifier DV2 is present at the control terminals T4G, T5G of the transistors T4 and T5, respectively.

The differential amplifier DV2 comprises three n-channel MOS transistors T1, T2, T3, two equivalent resistors R1, and a voltage regulating circuit $V_{CC}$. The differential amplifier DV2 serves for amplifying the input signals $V_{IN+}$ and $V_{IN-}$, inverting them, and providing them with a voltage offset. In the differential amplifier DV2, the source terminals T1S, T2S of the transistors T1 and T2 are connected to each other and to a current source whose current I1 is determined with the aid of a control terminal T3G of the transistor T3. The drain terminal T1D of the transistor T1 is connected to the control terminal T4G of the transistor T4 and a terminal of one of the two equivalent resistors R1; the drain terminal T2D of the transistor T2 is connected to the control terminal T5G of the transistor T5 and to a terminal of the other of the two equivalent resistors R1. A voltage $V_{Ghigh}$ which is determined by the voltage regulating circuit $V_{CC}$ is connected to the other respective terminal of the two equivalent resistors R1. By setting $V_{Ghigh}$, the identical resistances R1, and the current I1 in the differential amplifier DV2, a high and low level of signals VR1+ and VR1− pending at the drain terminals T1D, T2D of the transistors T1 and T2, respectively, can be precisely set, whereby $V_{Ghigh}$ represents the high level and $V_{Glow} = V_{Ghigh} - R1 \cdot I1$ represents the low level. By means of these high and low levels from the differential amplifier DV2, the desired output voltage $V_{OUT}$ at the output of the output stage can be set (taking into consideration the gate-source voltage $V_{GS}$ of the transistors T4 and T5).

According to the LVDS specifications, a voltage offset or swing at the output $V_{OUT}$ of the output stage should equal 1.2 V. A voltage swing of 350 mV results from an output current $I_{OUT}$ of approximately 3.5 mA such as is required for LVDS stages and a load resistance $R_{OUT}$ of 100 ohms which is common for LVDS. In the case of a fully blocking transistor T4 or T5, the lower level of the output signal is determined by the voltage drop across the current source T8. Since one of the transistors T4 or T5 is currentless in this case, the output resistance $R_{OUT}$ remains high. If the current I2 is selected higher than $V_{OUT}/R_{OUT}$ (3.5 mA) with the aid of a suitable voltage at the control terminal T8G of the transistor T8, the respective transistor T4 or T5 (the one with the lower voltage level) remains partially conductive as long as a voltage $V_{contr} = V_{Ghigh} - R1 \cdot I1$ is set. A corresponding output resistance $R_{OUT}$ can be set by the allocation, to the current source T8, of a value of the current I2 which ensures that the current $I_R = I2 - I_A$ flows through the respective transistor T4 or T5 at which the lower control signal is present. The output resistance $R_{OUT}$ is thus defined by the voltage drops across the source and drain terminals T4S, T5S, T4D, T5D of the transistors T4 and T5 and the partial currents $I_R$, $I_{OUT}$ flowing through them. The output resistance $R_{OUT}$ of approx. 50 ohms that is needed for LVDS signals can be realized by means of dimensioning the transistors T4 and T5 and setting the current I2.

Figure 2:
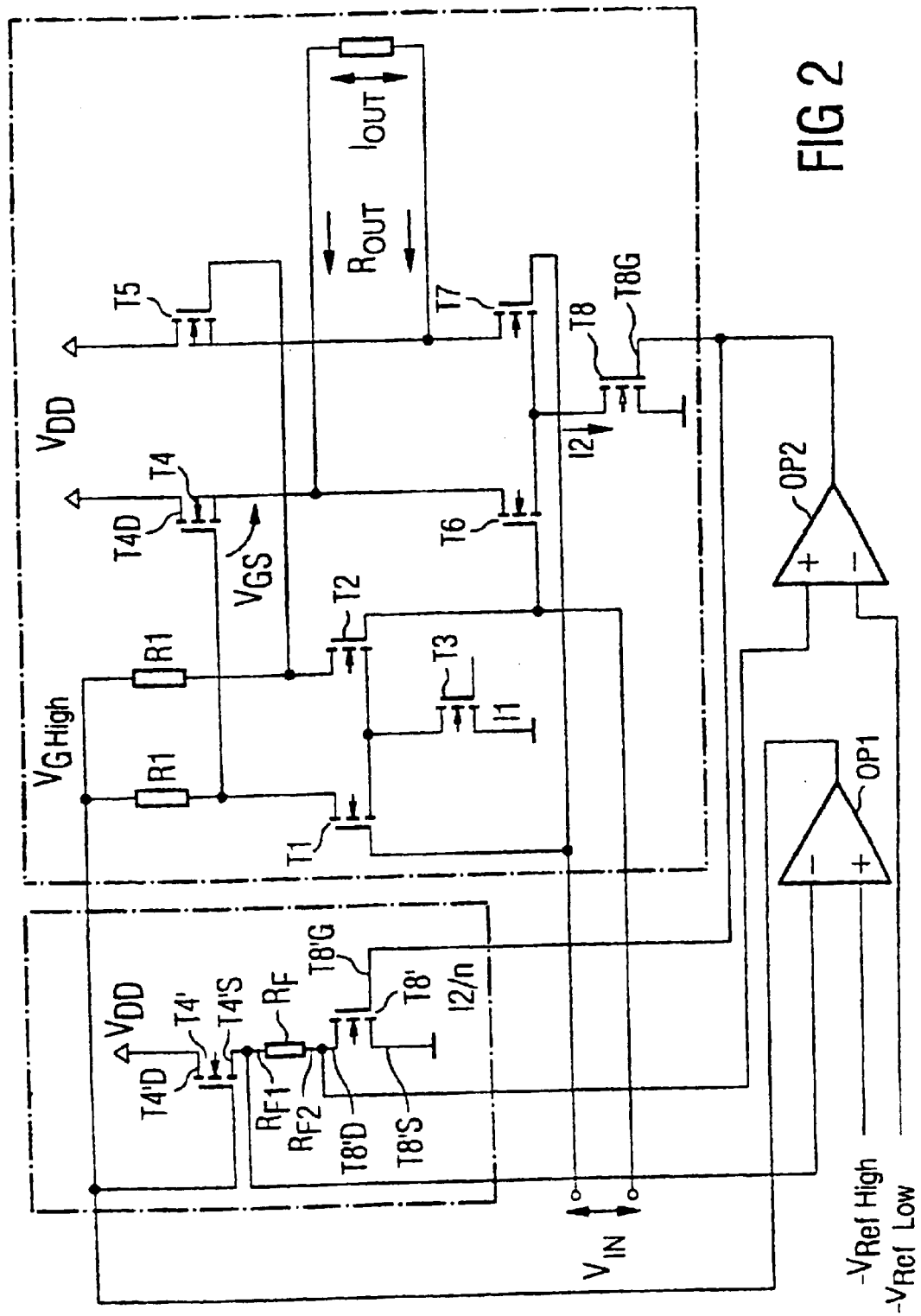
FIG. 2 is a schematic block diagram of the LVDS output stage according to FIG. 1 with a mirror circuit.

FIG. 2 also represents a mirror circuit in addition to the output stage represented in FIG. 1. The mirror circuit simulates the output stage and delivers a suitable $V_{Ghigh}$ and a suitable control signal for setting the current I2 to the control terminal T8G of the current source T8. The mirror circuit comprises a transistor T4', which is the same type as the transistors T4 or T5; a transistor T8' which is the same type as the transistor T8 forming the current source; a resistor $R_F$ of 100 ohms which is equal to the load resistance $R_{OUT}$; and two operational amplifiers OP1 and OP2.

The drain terminal T4'D of the transistor T4' is connected to a supply voltage potential $V_{DD}$. The source terminal T4'S of the transistor T4' is connected to a terminal of the resistor $R_F$. The other terminal of the resistor $R_F$ is connected to the drain terminal T8'D of the transistor T8'. The source terminal T8'S of the transistor T8' is applied to ground. A reference voltage input for the high level $V_{VRefHigh}$ is connected to a non-inverting input of the operational amplifier OP1. The inverting input of the operational amplifier OP1 is connected to the source terminal T4'S of the transistor T4'. The output of the operational amplifier OP1 is adjacent the control input T4'G of the transistor T4' and, as $V_{Ghigh}$, the two equivalent resistors R1 of the differential amplifier DV2. The drain terminal T8'D of the transistor T8' is connected to the non-inverting input of the operational amplifier OP2 at whose inverting input the reference voltage for the low level $V_{RefLow}$ is applied. The output of this operational amplifier OP2 is connected to the control input T8G of the transistor T8 which forms the current source I2, and to the control input T8'G of the transistor T8' in the mirror circuit.

The mirror circuit works in such a way that the reference voltages are present at the resistor $R_F$; with $V_{RefHigh}$ pending at an $R_{F1}$ terminal of the resistor $R_F$; and $V_{RefLow}$ pending at an $R_{F2}$ terminal of the resistor $R_F$. The operational amplifier OP1 with the transistor T4' represents a regulating element which sets the control voltage at the terminal $R_{F1}$ of the resistor $R_F$ such that the voltage potential at the terminal $R_{F1}$ corresponds exactly to $V_{RefHigh-}$. Because the two transistors T4 and T4' are identical and connected parallel to one another, the level $V_{RefHigh-}$ is also present at the output resistance $R_{OUT}$. Likewise, the operational amplifier OP2 and the transistor T8' represent a regulating element, which holds the voltage potential at a terminal $R_{F2}$ of the resistor $R_F$ exactly at $V_{RefLow}$ by the impressing of a defined current via the control terminal T8'G of the transistor T8', which current brings about a defined voltage drop across the resistor $R_F$. The voltage at the control terminal T8'G of the transistor T8' is likewise applied to the transistor T8 of the current source, with the result that the same current flows through the transistor T8 as flows through the transistor T8'.

The tables 1 and 2 represent states and levels of the transistors and signals (FIG. 1):

TABLE 1

| Signal/ Transistor | $V_{IN+}$ | $V_{IN-}$ | T1 | T2 | VR1+ | VR1− | T4* |
|---|---|---|---|---|---|---|---|
| State/Level | high | low | conductive | blocking | low | high | blocking* |
| State/Level | low | high | blocking | conductive | high | low | conductive |

*> or partially blocking

TABLE 2

| Signal/ Transistor | T5 | T6 | T7 | $V_{OUT+}$ | $V_{OUT-}$ |
|---|---|---|---|---|---|
| State/Level | conductive | conductive | blocking | low | high |
| State/Level | blocking | blocking | conductive | high | low |

By virtue of the mostly integrated design, identical transistors can be fabricated on a substrate; however, the parameters can be set only with large tolerances owing to process fluctuations.

With the aid of the described mirror circuit, $V_{Ghigh}$ and the control voltage of the transistor T8, and therefore $VG_{low}$, can be set without knowledge of the precise parameters of the transistors.

In order to minimize the power consumption of the mirror circuit, it is possible to correspondingly scale the transistors and the resistor to a scaling factor.

We claim:

1. An electronic output stage for amplifying differential input signals with a small voltage swing, the output stage comprising:
   a first input terminal, a second input terminal, a first output terminal, and a second output terminal;
   a controlled current source;
   a first transistor having a first terminal connected to said controlled current source, a second terminal, and a control terminal connected to said first input terminal;
   a second transistor having a first terminal connected to said controlled current source, a second terminal, and a control terminal connected to said second input terminal;
   a third transistor having a first terminal connected to a first supply voltage potential, a second terminal connected to said second terminal of said first transistor and to said first output terminal;
   a fourth transistor having a first terminal connected to the first supply voltage potential, a second terminal connected to said second terminal of said second transistor and to said second output terminal;
   said control terminals of said third and fourth transistors receiving respective drive signals formed from the input signals by amplifying and providing the input signals with an adjustable offset voltage;
   a voltage change of the input signals and drive signals at said first and third transistors and at said second and fourth transistors, respectively, behaving in opposite ways; and
   a mirror circuit for setting a current through said first and second output terminals and a voltage between said first and second output terminals, said mirror circuit having two input terminals carrying respective reference voltages and said mirror circuit controlling said current source and the offset voltage to cause a low level at one of said output terminals and a high level at another of said output terminals to correspond to each of the respective reference voltages.

2. The output stage according to claim 1, wherein said first and second input terminals are configured to receive high-frequency input signals.

3. The output stage according to claim 1, wherein at least one of the output voltages of said output terminal is adjustable with the offset voltage, and a current flowing through said first and second output terminals and an output resistance is adjustable with said current source and a dimensioning of said third and fourth transistors.

4. The output stage according to claim 1, wherein said first and second transistors have equal dimensions, and said third and fourth transistors have equal dimensions.

5. The output stage according to claim 1, wherein said first, second, third, and fourth transistors are NOS transistors.

6. The output stage according to claim 5, which comprises a differential amplifier circuit for setting the offset voltage such that said third and fourth transistors are at least partly conductive.

7. The output stage according to claim 1, wherein the current source is set such that an output current equals approximately 3.5 mA.

8. The output stage according to claim 1, wherein said third and fourth transistors are dimensioned such that an output resistance between said first and second output terminals equals approximately 50 ohms.

9. The output stage according to claim 1, wherein the offset voltage is set to result in a voltage offset value between said first and second output terminals of approximately 1.2 V.

10. The output stage according to claim 1, which comprises a voltage control circuit for regulating the offset voltage.

11. The output stage according to claim 10, which comprises a differential amplifier circuit having a voltage supply, and wherein the offset voltage is regulated by controlling the voltage supply to said differential amplifier.

12. The output stage according to claim 6, wherein the offset voltage is regulated by controlling a voltage supply to said differential amplifier.

13. The output stage according to claim 10, wherein a high level of the output voltage is set with the regulated offset voltage.

14. The output stage according to claim 10, wherein a low level of the output voltage is set by the current impressed by said current source.

* * * * *